(12) United States Patent
Jeong

(10) Patent No.: US 8,345,501 B2
(45) Date of Patent: Jan. 1, 2013

(54) SEMICONDUCTOR MEMORY DEVICE CORRECTING FUSE DATA AND METHOD OF OPERATING THE SAME

(75) Inventor: Byung-Hoon Jeong, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/281,762

(22) Filed: Oct. 26, 2011

(65) Prior Publication Data

US 2012/0188830 A1    Jul. 26, 2012

(30) Foreign Application Priority Data

Jan. 25, 2011    (KR) .................. 10-2011-0007304

(51) Int. Cl.
*G11C 17/18* (2006.01)
*G11C 17/00* (2006.01)
*G11C 7/00* (2006.01)

(52) U.S. Cl. .................. 365/225.7; 365/96; 365/200

(58) Field of Classification Search ............... 365/225.7
See application file for complete search history.

(56) References Cited

U.S. PATENT DOCUMENTS

| 7,280,415 B2 * | 10/2007 | Hwang et al. ............ 365/189.09 |
| 7,525,871 B2 * | 4/2009 | Nagai et al. ................ 365/225.7 |

FOREIGN PATENT DOCUMENTS

| JP | 2001-351395 | 12/2001 |
| JP | 2005-116003 | 4/2005 |
| KR | 1020070013110 A | 1/2007 |

\* cited by examiner

*Primary Examiner* — Son Mai
(74) *Attorney, Agent, or Firm* — Volentine & Whitt, PLLC

(57) ABSTRACT

A semiconductor memory device and method of operating same are described. The semiconductor memory device includes a first anti-fuse array having a plurality of first anti-fuse elements that store first fuse data, a second anti-fuse array having a plurality of second anti-fuse elements that store error correction code (ECC) data associated with the first fuse data, and an ECC decoder configured to generate second fuse data by correcting the first fuse data using the ECC data.

18 Claims, 6 Drawing Sheets

SEMICONDUCTOR MEMORY DEVICE CORRECTING FUSE DATA AND METHOD OF OPERATING THE SAME

This application claims priority from Korean Patent Application No. 10-2011-0007304 filed on Jan. 25, 2011, the subject matter of which is hereby incorporated by reference.

BACKGROUND OF THE INVENTION

The present inventive concept relates to semiconductor memory devices and methods of operating same. More particularly, the inventive concept relates to semiconductor memory devices that are capable of correcting errors in fuse data and methods of operating same.

Contemporary semiconductor memory devices often include redundancy memory cell arrays that are used to replace defective memory cells in a primary (or main) memory cell array. The replacement of defective memory cells with redundant memory cells allows more efficient and reliable use of the memory cell array during read and write (programming) operations. The redundant memory cells may be used as replacements on a sub-array block basis, a row-by-row basis, a column-by-column basis, or an individual memory cell-by-memory cell basis.

Following fabrication of the memory cell array at some point during the wafer stage of manufacturing, defective memory cells are identified by standard tests, and information regarding the defective memory cells is stored. Defective memory cell information is often stored in a nonvolatile manner using one or more array(s) of fuses. Individual fuses may be variously and selectively programmed or not-programmed by (e.g.) application of electrical current or a laser beam to particular portion(s) of the fuse.

An anti-fuse element is a well-known element that includes one electrode (a first terminal), an intervening insulating material, and an opposing electrode (a second terminal). A voltage difference between terminals of the anti-fuse element may be used to destroy the insulating material causing the two electrodes to short-circuit. A voltage that destroys the insulating material of the anti-fuse element is referred to as a programming voltage. Using this programming voltage, fuse data (e.g., information regarding defective memory cells) may be stored in the anti-fuse element.

However, during operation of the semiconductor memory device, some anti-fuse elements may malfunction. Such malfunctions are a cause for concern since anti-fuses may not be fixed during normal operations of the semiconductor memory device.

SUMMARY OF THE INVENTION

Certain embodiments of the inventive concept provide semiconductor memory devices and related methods of operation that improve the overall reliability of fuse data used in conjunction with read and write operations performed by the semiconductor memory device.

In one embodiment, the inventive concept provides a semiconductor memory device comprising; a first anti-fuse array comprising a plurality of first anti-fuse elements that store first fuse data, a second anti-fuse array comprising a plurality of second anti-fuse elements that store error correction code (ECC) data associated with the first fuse data, and an ECC decoder configured to generate second fuse data by correcting the first fuse data using the ECC data.

In another embodiment, the inventive concept provides a method of operating a semiconductor memory device including a memory cell array and a redundant memory cell array. The method comprises; storing first fuse data in a first array of anti-fuse elements, wherein the first fuse data identifies respective locations for defective memory cells in the memory cell array, storing ECC data associated with the first fuse data in a second array of anti-fuse elements, within an anti-fuse box including the first array of anti-fuse elements and the second array of anti-fuse elements, correcting at least one error in the first fuse data using the ECC data to generate second fuse data, comparing the second fuse data with addresses for a plurality of memory cells in the memory cell array to generate a redundancy signal, and applying the redundancy signal to an address decoder to replace the plurality of memory cells with a corresponding plurality of redundant memory cells in the redundant memory cell array.

BRIEF DESCRIPTION OF THE DRAWINGS

The above and other aspects and features of the inventive concept will become more apparent upon consideration of certain embodiments illustrated in the attached drawings, in which.

DETAILED DESCRIPTION

Embodiments of the inventive concept will now be described in some additional details with reference to the accompanying drawings. The inventive concept may, however, be embodied in many different forms and should not be construed as limited being to only the illustrated embodiments. Rather, these embodiments are provided so that this disclosure will be thorough and complete, and will fully convey the scope of the invention to those skilled in the art. Throughout the written description and drawings, like reference numbers and labels are used to denote like or similar elements and features.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
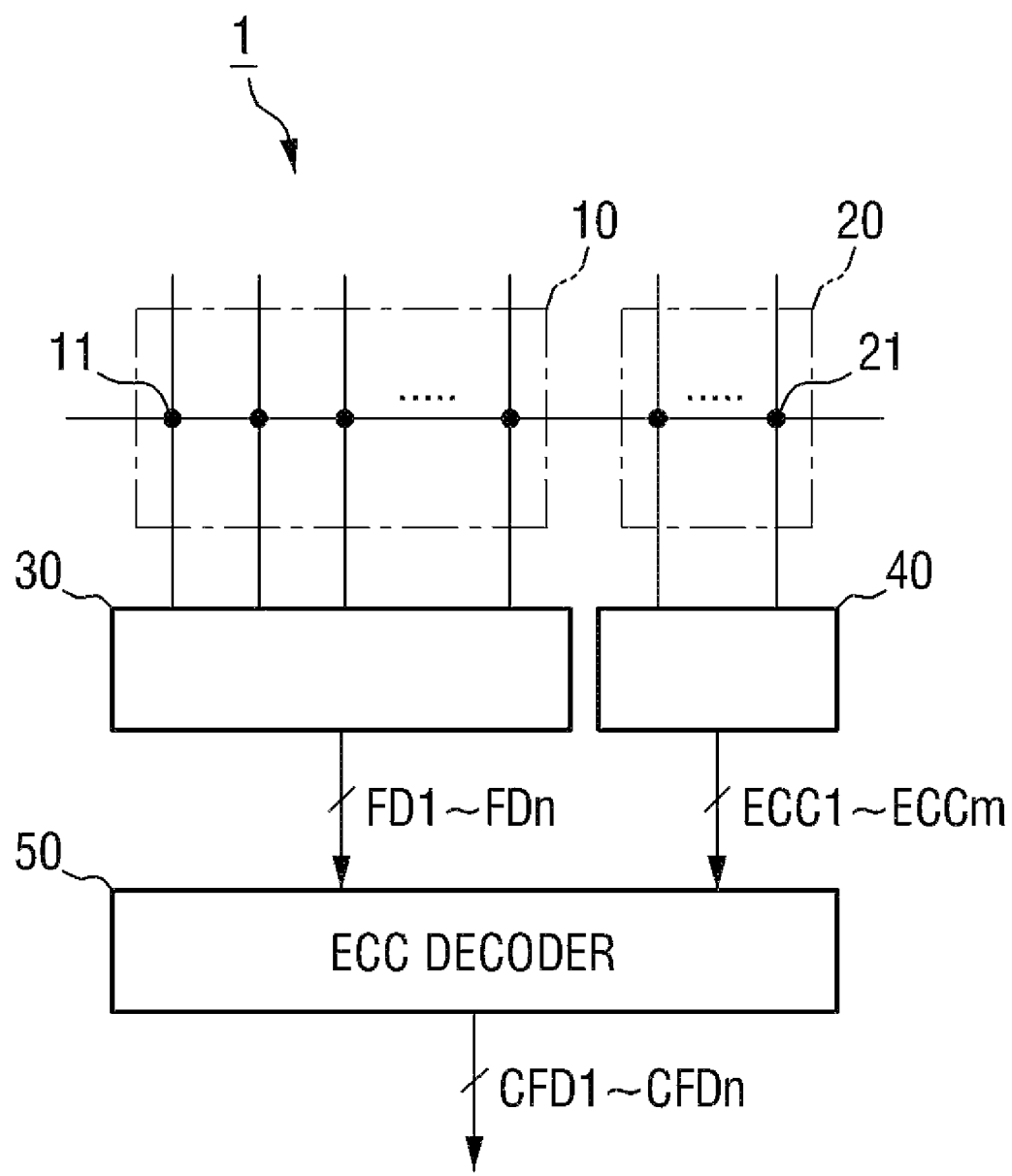
FIG. 1 is a block diagram of a semiconductor memory device according to an embodiment of the inventive concept.

FIG. 1 is a partial block diagram of a semiconductor memory device according to an embodiment of the inventive concept, and principally illustrates, in relevant portion, an anti-fuse box 1. The anti-fuse box 1 comprises a first anti-fuse array 10, a second anti-fuse array 20, a first input/output (I/O) unit 30, a second I/O unit 40, and an error correction code (ECC) decoder 50.

The first anti-fuse array 10 includes a plurality of first anti-fuse elements 11 respectively storing first fuse data FD1 through FDn. In certain embodiments of the inventive concept, the first fuse data FD1 through FDn may be information identifying defective memory cells in a memory cell array (not shown) of the semiconductor memory device. In certain embodiments, the first anti-fuse elements 11 may be formed from resistive fuse elements exhibiting a high resistance (e.g., 100 MΩ) before being programmed but exhibiting a low resistance (e.g., 100 KΩ or less) after being programmed.

In certain embodiment, each of the first anti-fuse elements 11 may have an electrode/insulating material/electrode structure, wherein the insulating material may include one or more materials such as silicon dioxide (SiO2), silicon nitride (SiN), tantalum oxide (TaO), silicon dioxide-silicon nitride-silicon dioxide (ONO), etc. Each of the first anti-fuse elements 11 may be programmed by one or more conventionally understood methods that essentially destroys the insulating material by application of a high voltage (e.g., 10 V) to the electrodes over a defined period of time. Thus, when a first anti-fuse element 11 is programmed, the opposing electrodes are no longer electrically insolated (e.g., an electrical "short" exists between the electrodes) and the resistance of the first anti-fuse element 11 is dramatically reduced.

The second anti-fuse array 20 includes a plurality of second anti-fuse elements 21. In certain embodiments of the inventive concept, the plurality of second anti-fuse elements will store ECC data ECC1 through ECCm related to (e.g., derived from or calculated using) the first fuse data FD1 through FDn. The ECC data may be used to detect and/or correct errors associated with the first fuse data FD1 through FDn. Having this relationship, the ECC fuse data may be said to be "associated with the first fuse data". Like the first anti-fuse elements 11, each of the second anti-fuse elements 21 may have an electrode/insulating material/electrode structure.

The first I/O unit 30 may be used to program the first fuse data FD1 through FDn in the first anti-fuse array 10 or read the first fuse data FD1 through FDn stored by the first anti-fuse array 10. One possible configuration for the first I/O unit 30 will be described hereafter with reference to FIG. 2.

The second I/O unit 40 may be used to program the ECC data ECC1 through ECCm to the second anti-fuse array 20 or read the ECC data ECC1 through ECCm stored by the second anti-fuse array 20.

The ECC decoder 50 is configured to receive the first fuse data FD1 through FDn and the ECC data associated with the first fuse data ECC1 through ECCm, and generate second fuse data CFD1 through CFDn, as essentially an ECC corrected version of the first fuse data FD1 trough FDn using the ECC data ECC1 through ECCm. During a power-up operation for the semiconductor memory device, the ECC decoder 50 may thus be used to generate error-free, second fuse data CFD1 through CFDn by correcting any errors present in the stored first fuse data FD1 through FDn.

Those of ordinary skill in the art will recognize that the ECC data ECC1 through ECCm may take many different forms depending on the nature of the ECC protocol being used by the semiconductor memory device. However, the ECC data may be generally viewed as additional information sufficient to detect and correct up to a predetermined number of errors in the first fuse data.

For example, in certain embodiments a given ECC protocol may be used to detect and correct a one-bit error in the ECC data. To correct the one-bit error, (k+1) bits of additional information (i.e., ECC data) is for every $2^k$ bits of first fuse data. Assuming the first fuse data is equal to $2^8$ or 256 bits and a one-bit error correction capability, the required second fuse data will be (8+1) or 9 bits. Extending this simple example, those skilled in the art will recognize that two-bit or greater numbers of errors in the first fuse data may be detected and/or corrected with the provision of more additional data. The choice of one or more error detection and correction capabilities will be made in view of available memory device and/or system resources, operating speed(s) for the semiconductor memory device, and intended application(s). Ready examples of ECC protocols that might be used in embodiments of the inventive concept include those using a; Hamming code, Huffman code, parity bit(s), turbo code, cyclic code, low-density parity-check code, Reed-Muller code, and Reed-Solomon error correction code.

Regardless of the particular ECC protocol used, embodiments of the inventive concept will provide a semiconductor memory device operating in response to highly reliable (error-free) second fuse data CFD1 through CFDn. Assuming that the first fuse data FD1 through FDn stored in the first anti-fuse array 10 identifies defective memory cells in a memory cell array of the semiconductor memory device, certain "repair" operations whereby the defective memory cells are replaced or variously accounted for in the memory cell array may be accomplished with improved certitude.

Since the ECC data includes far fewer bits than the first fuse data FD1 through FDn, the second anti-fuse array 20 may be relatively small.

Figure 2:
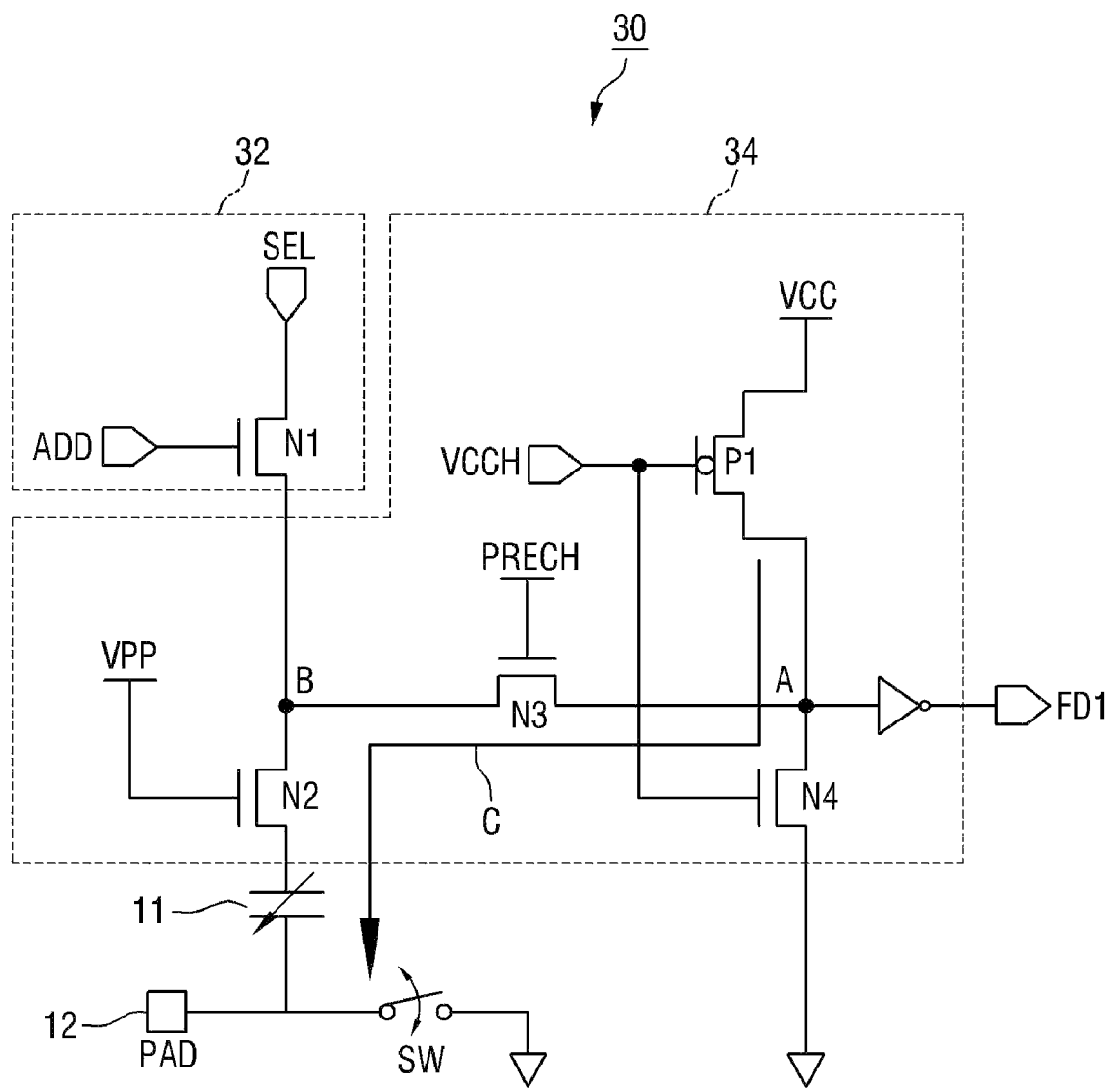
FIG. 2 is a circuit diagram further illustrating the first input/output unit of FIG. 1.

FIG. 2 is a circuit diagram further illustrating, in relevant portion, the first I/O unit 30 of FIG. 1. In certain related embodiments of the inventive concept, the structure of the second I/O unit 40 may be substantially similar to that of the first I/O unit 30 shown in FIG. 1.

Referring to FIG. 2, the first I/O unit 30 comprises a programming unit 32 and a sensing unit 34.

In its operation, the programming unit 32 may be used to program each of the first anti-fuse elements 11 by changing its ON-resistance. The programming unit 32 shown in FIG. 2 includes a first n-channel metal oxide semiconductor (NMOS) transistor N1 having a gate connected to a fuse address signal ADD and controlling a connection an applied select signal SEL with a programming node B.

In its operation, the sensing unit 34 detects whether or not each of the first anti-fuse elements 11 is programmed. The sensing unit 34 of FIG. 2 includes a second NMOS transistor N2, a third NMOS transistor N3, a p-channel metal oxide semiconductor (PMOS) transistor P1, and a fourth NMOS transistor N4. The second NMOS transistor N2 has a gate connected to a step-up voltage VPP controlling a connection of the programming node B with each of the first anti-fuse elements 11. The third NMOS transistor N3 has a gate connected to a pass-signal PRECH controlling a connection between an output node A and the programming node B. The PMOS transistor P1 has a gate connected to a power-up reset signal VCCH controlling a connection between a power supply voltage VCC and the output node A. The fourth NMOS transistor N4 has a gate connected to the power-up reset signal VCCH controlling a connection between the output node A and ground.

An exemplary programming operation performed by the first I/O unit 30 will now be described. It is initially assumed that a switch SW is turned OFF and one electrode (i.e., a terminal) of each of the first anti-fuse elements 11 is connected to a corresponding pad 12.

To program the first anti-fuse elements 11, the fuse address signal ADD is applied with a high level (hereafter "high") to the gate of the first NMOS transistor N1 such that the select signal SEL is applied to the programming node B. Assuming the level of the select signal SEL is "low" (i.e., the logical opposite of a high), the programming node B is made correspondingly low. Then, a high voltage of (e.g., approximately 10 V) is applied to the terminal of the firstanti0fuse elements 11 from the pad 12. Under these bias conditions, a large voltage difference between the opposing terminals of each of the first anti-fuse elements 11 will destroy the intervening insulating material, thereby placing selected first anti-fuse elements 11 in a programmed state.

To "not-program" the first anti-fuse elements 11, the high fuse address signal ADD is not applied to the gate of the first NMOS transistor N1. Thus, the programming node B will continue to float. The resulting voltage difference across the opposing terminals respectively connected to the programming node B and the pad 12 when the high voltage is applied will be insufficient to destroy the insulating film of each of the first anti-fuse elements 11. As a result, selected first anti-fuse elements 11 will remain in a not-programmed state.

An exemplary sensing operation executed by the first I/O unit 30 will now be described. The sensing operation will typically be performed for the first anti-fuse elements 11 during a power-up routine for the semiconductor memory device. Here, the switch SW is closed, and one terminal of each of the first anti-fuse elements 11 is connected to ground. Since the step-up circuit does not operate during the power-up routine, the pass signal PRECH and the step-up voltage VPP will be equal to the power supply voltage VCC.

When the power supply voltage VCC is greater than or equal to a predetermined voltage (as defined in view of the design parameters of the constituent transistors) during power-up, the second and third NMOS transistors N2 and N3 are turned ON. Therefore, for each programmed anti-fuse element 11, current will flow through the pathway indicated by an arrow C in FIG. 2, and accordingly the programming node A becomes low. On the other hand, for each not-programmed anti-fuse element 110, no current flows and the programming node A becomes high. In the specific embodiment of FIG. 2, an output voltage apparent at the output node A is provided as corresponding first fuse data FD1 via an inverter.

Figure 3:
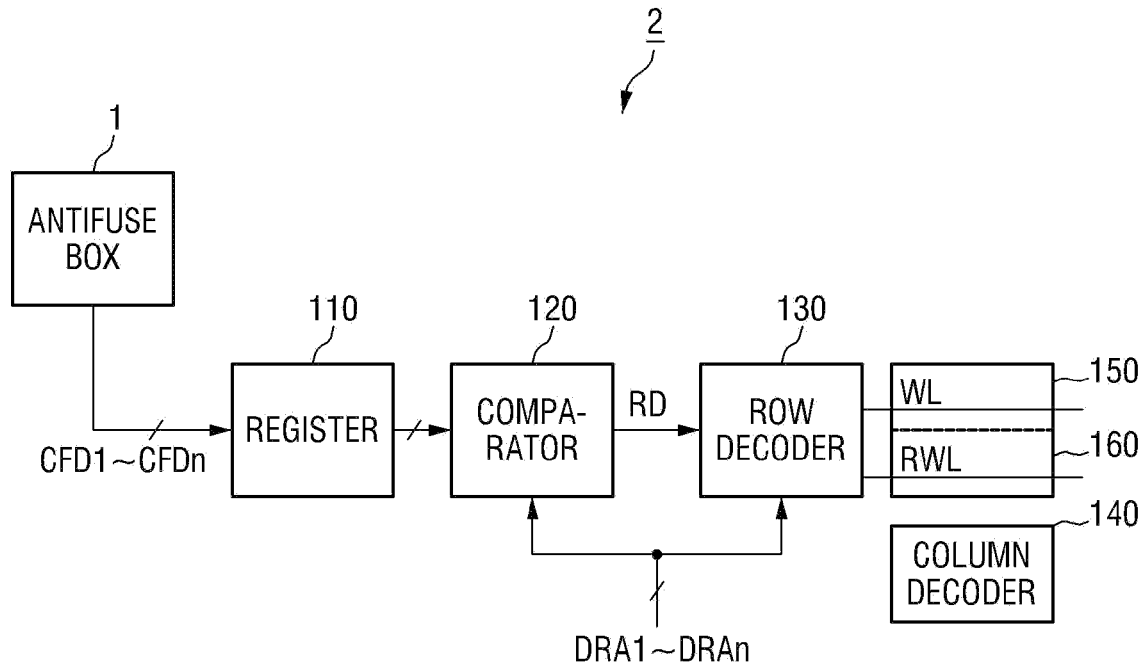
FIG. 3 is a block diagram of a semiconductor memory device according to another exemplary embodiment of the inventive concept.
Figure 4:
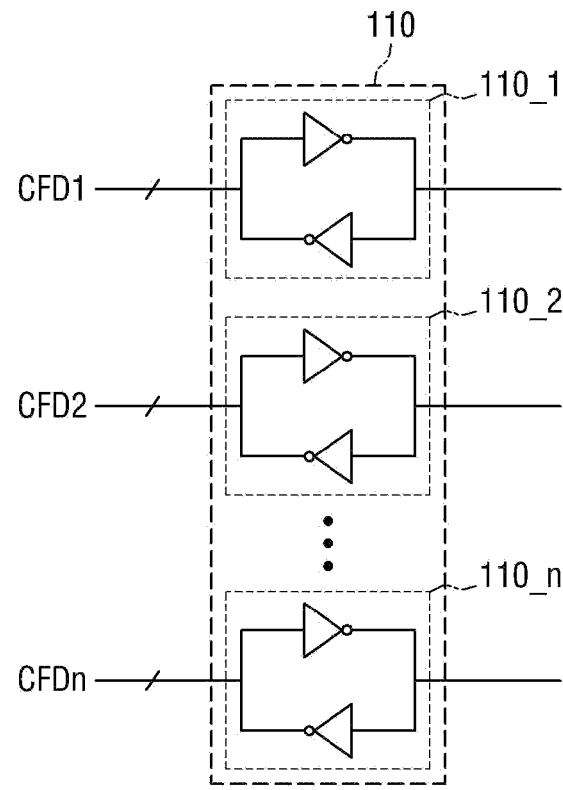
FIG. 4 is a circuit diagram further illustrating the register of FIG. 3.
Figure 5:
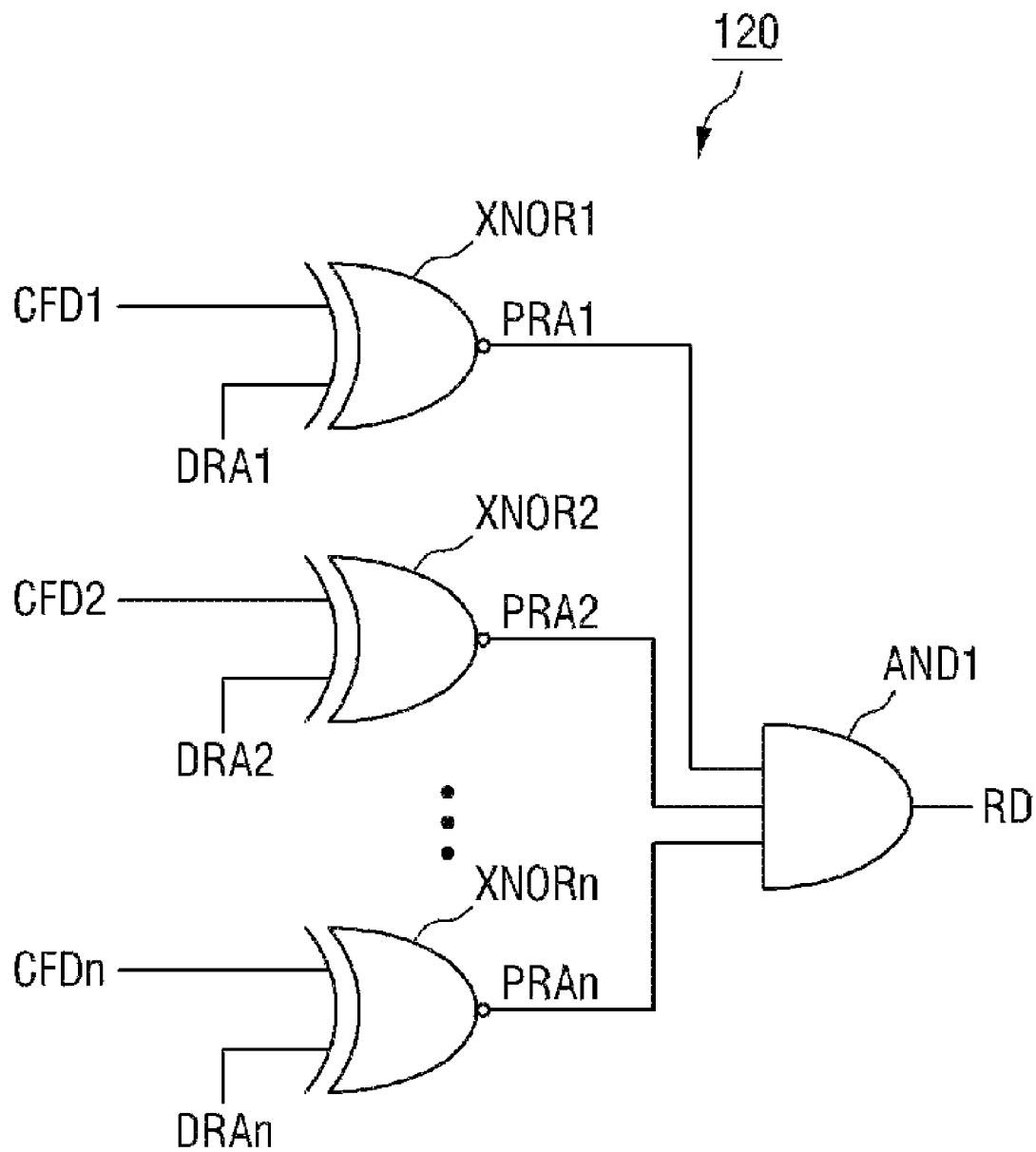
FIG. 5 is a circuit diagram further illustrating the comparator of FIG. 3.

FIG. 3 is a block diagram of a semiconductor memory device according to an embodiment of the inventive concept incorporating an anti-fuse box 1 like the one described in relation to FIGS. 1 and 2. FIG. 4 is a circuit diagram further illustrating the register 110 of FIG. 3, and FIG. 5 is a circuit diagram further illustrating the comparator 120 of FIG. 3.

Referring to FIG. 3, a semiconductor memory device 2 comprises in relevant portion a memory cell array 150, a redundant cell array 160, a row decoder 130, a column decoder 140, an anti-fuse box 1, the register 110, and the comparator 120.

The memory cell array 150 will include a plurality of memory cells. The memory cells may be of any type including but not limited to dynamic random access memory (DRAM), phase-change RAM (PRAM), resistive RAM (RRAM), and flash cells.

The redundant cell array 160 will include a plurality of redundant memory cells. The redundant memory cells may be, but need not necessarily be, of the same type as the cells in the memory cell array.

The row decoder 130 and the column decoder 140 conventionally operate to designate a memory cell or a redundant memory cell within the memory cell array 150 or the redundant cell array 160. During a repair operation of the semiconductor memory device 2 may, for example, replace a row of memory cells in the memory cell array 150 with a row of redundant memory cells from the redundant cell array 160.

As described above with reference to FIGS. 1 and 2, the anti-fuse box 1 may include a first anti-fuse array 10 that stores first fuse data FD1 through FDn, a second anti-fuse array 20 that stores ECC data ECC1 through ECCm, and an ECC decoder 50 that generates second fuse data CFD1 through CFDn by correcting the first fuse data FD1 through FDn using the ECC data ECC1 through ECCm.

The register 110 may be used to store the ECC data ECC1 through ECCm, and may be implemented using, for example, a plurality of static RAMs (SRAMs) 110_1 through 110_n, as shown in FIG. 4.

The comparator 120 compares the second fuse data CFD1 through CFDn stored in the register 110 with addresses DRA1 through DRAn and outputs a redundancy signal RD as a result of the comparison.

Specifically, referring to FIG. 5, one possible embodiment of the comparator 120 may include a plurality of XNOR gates XNOR1 through XNORn and an AND gate AND1. The XNOR gates XNOR1 through XNORn respectively output address comparison signals PRA1 through PRAn at a high level when the input second fuse data CFD1 through CFDn match addresses DRA1 through DRAn and respectively output the address comparison signals PRA1 through PRAn at a low level when the second fuse data CFD1 through CFDn do not match the addresses DRA1 through DRAn. The AND gate AND1 performs an AND operation on the address comparison signals PRA1 through PRAn and outputs the redundancy signal RD. Only when all of the address comparison signals PRA1 through PRAn are at a high level, the redundancy signal RD at a high level is output.

Referring back to FIG. 3, the row decoder 130 receives the redundancy signal RD and replaces a row of memory cells with a row of redundancy memory cells. That is, the row decoder 130 selects a redundant word line RWL instead of a word line WL corresponding to the addresses DRA1 through DRAn in response to the redundancy signal RD.

Figure 6:
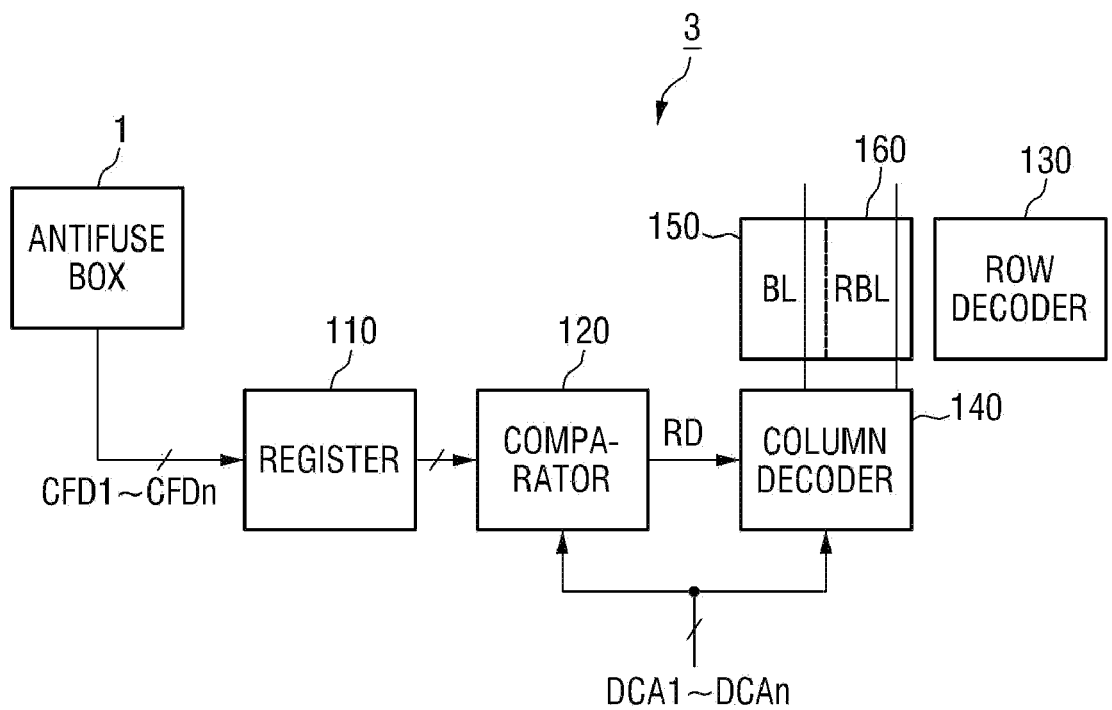
FIG. 6 is a block diagram of a semiconductor memory device according to another embodiment of the inventive concept.

FIG. 6 is a block diagram of a semiconductor memory device according to another embodiment of the inventive concept.

Referring to FIG. 6, in a semiconductor memory device 3, a column decoder 140 receives the redundancy signal RD and replaces a column of memory cells in the memory cell array 150 with a column of redundant memory cells from the redundant cell array 160. That is, the column decoder 140 selects a redundant bit line RBL instead of a bit line BL corresponding to addresses DCA1 through DCAn in response to the redundancy signal RD.

Figure 7:
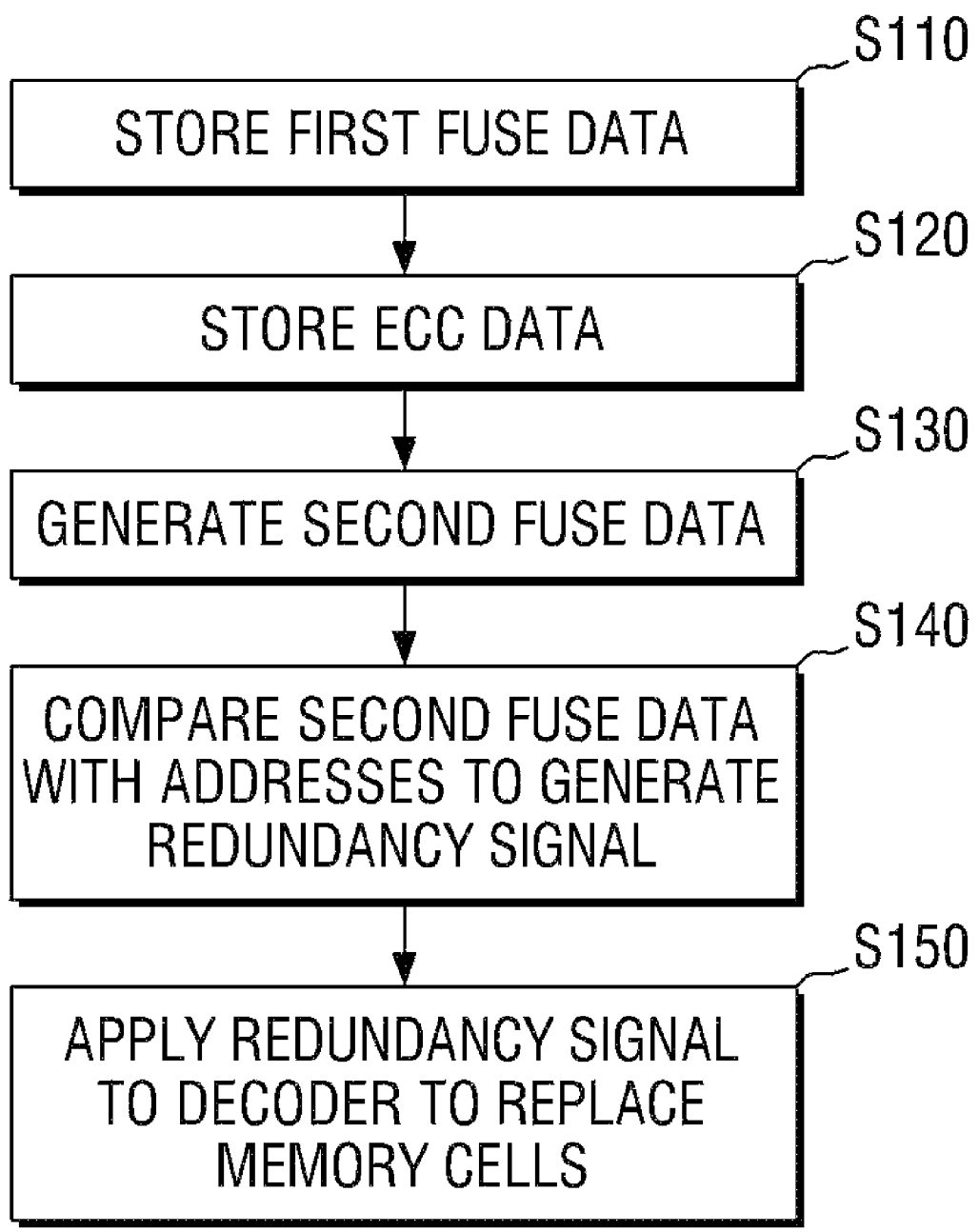
FIG. 7 is a flowchart summarizing a method of operating a semiconductor memory device according to an embodiment of the inventive concept.

FIG. 7 is a flowchart summarizing a method of operating a semiconductor memory device according to an embodiment of the inventive concept. The method begins by storing first fuse data in a first array of anti-fuse elements, wherein the first fuse data identifies respective locations for defective memory cells in the memory cell array (S110), and storing ECC data associated with the first fuse data in a second array of anti-fuse elements (S120). The first and second arrays of anti-fuse elements may be co-located in an anti-fuse box disposed in the semiconductor device or located external to the semiconductor memory device.

Then, during a power-up routine for the semiconductor memory device and using the first fuse data stored in the first array of anti-fuse elements and ECC data stored in the second array of anti-fuse elements, the first fuse data is corrected using the ECC data to generate second fuse data (S130). The second fuse data is then compared to addresses for a plurality of memory cells in the memory cell array to generate a redundancy signal (S140). Then, the redundancy signal is compared in an address decoder with addresses in order to selectively replace a plurality of memory cells with a corresponding plurality of redundant memory cells in the redundant memory cell array.

While the present inventive concept has been particularly shown and described with reference to exemplary embodiments thereof, it will be understood by those of ordinary skill in the art that various changes in form and detail may be made therein without departing from the scope of the following claims.

What is claimed is:

1. A semiconductor memory device comprising:
   a first anti-fuse array comprising a plurality of first anti-fuse elements that store first fuse data;
   a second anti-fuse array comprising a plurality of second anti-fuse elements that store error correction code (ECC) data associated with the first fuse data; and
   an ECC decoder configured to generate second fuse data by correcting the first fuse data using the ECC data.

2. The memory device of claim 1, further comprising:
   a memory cell array comprising a plurality of memory cells;
   a redundant memory cell comprising a plurality of redundant memory cells;
   a register that stores the second fuse data; and
   a comparator that compares the second fuse data stored in the register with addresses for the plurality of memory cell and provides a redundancy signal as a result of the comparison.

3. The memory device of claim 2, further comprising:
   a row decoder configured to receive the redundancy signal and the addresses and replace the plurality of memory cells with the plurality of redundant memory cells.

4. The memory device of claim 3, wherein the plurality of memory cells are memory cells connected to a common word line.

5. The memory device of claim 2, further comprising:
   a column decoder configured to receive the redundancy signal and the addresses and replace the plurality of memory cells with the plurality of redundant memory cells.

6. The memory device of claim 3, wherein the plurality of memory cells are memory cells connected to a common bit line.

7. The memory device of claim 2, wherein the plurality of memory cells are of one type selected from a group of DRAM cells, PRAM cells, RRAM cells, and flash cells.

8. The memory device of claim 7, wherein the plurality of redundant memory cells are of the same one type as the plurality of memory cells.

9. The memory device of claim 1, wherein the ECC decoder is further configured to generate the second fuse data during a power-up routine for the semiconductor memory device.

10. The memory device of claim 1, further comprising:
    a first input/output (I/O) unit that provides the first fuse data from the first anti-fuse array to the ECC decoder; and
    a second I/O unit that provides the ECC fuse data from the second anti-fuse array to the ECC decoder.

11. The memory device of claim 10, wherein the first I/O unit comprises:
    a pad coupled to a terminal of a first anti-fuse element among the plurality of first anti0fuse elements;
    a sensing unit including a programming node and an output node, the sensing unit being coupled to an opposing terminal of the first anti-fuse element; and
    a programming unit coupled to the programming node, the programming node comprising a first NMOS transistor having a gate that receives a fuse address signal to control connection of a select signal to the programming node,
    wherein the sensing unit comprises:
        a second NMOS transistor having a gate that receives a step-up voltage and being connected between the programming node and the opposing terminal;
        a third NMOS transistor having a gate that receives a pass signal and being connected between the programming node and the output node;
        a fourth NMOS transistor having a gate that receives a power-up reset signal and being connected between the output node and ground; and
        a PMOS transistor having a gate that receives the power-up reset signal and being connected between a power supply voltage and the output node.

12. The memory device of claim 1, wherein the ECC decoder corrects greater than a one bit error in the first fuse data.

13. A method of operating a semiconductor memory device comprising a memory cell array and a redundant memory cell array, the method comprising:
    storing first fuse data in a first array of anti-fuse elements, wherein the first fuse data identifies respective locations for defective memory cells in the memory cell array;
    storing ECC data associated with the first fuse data in a second array of anti-fuse elements;
    within an anti-fuse box including the first array of anti-fuse elements and the second array of anti-fuse elements, correcting at least one error in the first fuse data using the ECC data to generate second fuse data;
    comparing the second fuse data with addresses for a plurality of memory cells in the memory cell array to generate a redundancy signal; and applying the redundancy signal to an address decoder to replace the plurality of memory cells with a corresponding plurality of redundant memory cells in the redundant memory cell array.

14. The method of claim 13, wherein storing the first fuse data and the ECC data are performed before a subsequent power-up routine for the semiconductor memory device.

15. The method of claim 13, further comprising storing the second fuse data in a register before comparing the second fuse data with the addresses.

16. The method of claim 13, wherein correcting the at least one error in the first fuse data is performed during a power-up routine for the semiconductor memory device.

17. The method of claim 15, wherein the address decoder is a row decoder, and the plurality of memory cells are connected to a common word line in the memory cell array.

18. The method of claim 15, wherein the address decoder is a column decoder, and the plurality of memory cells are connected to a common bit line in the memory cell array.

* * * * *